US 11,084,965 B2

(12) United States Patent
Kudoh et al.

(10) Patent No.: US 11,084,965 B2
(45) Date of Patent: Aug. 10, 2021

(54) THERMALLY CONDUCTIVE COMPOSITION, THERMALLY CONDUCTIVE SHEET, AND METHOD FOR PRODUCING THERMALLY CONDUCTIVE SHEET (71) Applicant: SEKISUI POLYMATECH CO., LTD., Saitama (JP)

(72) Inventors: Hiroki Kudoh, Saitama (JP); Tomonari Yamada, Saitama (JP)

(73) Assignee: SEKISUI POLYMATECH CO., LTD., Saitama (JP)

(*) Notice: Subject to any disclaimer, the term of this patent is extended or adjusted under 35 U.S.C. 154(b) by 231 days.

(21) Appl. No.: 16/095,978

(22) PCT Filed: Apr. 7, 2017

(86) PCT No.: PCT/JP2017/014533
§ 371 (c)(1),
(2) Date: Oct. 24, 2018

(87) PCT Pub. No.: WO2017/187940
PCT Pub. Date: Nov. 2, 2017

(65) Prior Publication Data
US 2019/0092995 A1 Mar. 28, 2019

(30) Foreign Application Priority Data
Apr. 28, 2016 (JP) .............................. JP2016-090588

(51) Int. Cl.
C09K 5/14 (2006.01)
C08J 5/18 (2006.01)
(Continued)

(52) U.S. Cl.
CPC ................ *C09K 5/14* (2013.01); *B29C 35/02* (2013.01); *B29C 39/003* (2013.01); *B29C 39/38* (2013.01);
(Continued)

(58) Field of Classification Search
CPC .... Y10T 428/31663; F28F 21/02; B29D 7/01; C08J 2383/04; C08J 2383/05;
(Continued)

(56) References Cited

U.S. PATENT DOCUMENTS

2005/0101719 A1* 5/2005 Ishihara ................... C08K 7/06
524/495
2008/0213578 A1 9/2008 Endo et al.
(Continued)

FOREIGN PATENT DOCUMENTS

EP 1 878 767 A1 1/2008
EP 2 871 204 A1 5/2015
(Continued)

OTHER PUBLICATIONS

Millipore Sigma, Silicon Oil, accessed online Jul. 22, 2020.*
(Continued)

Primary Examiner — Camie S Thompson
(74) Attorney, Agent, or Firm — Buchanan, Ingersoll & Rooney PC (57) ABSTRACT To provide a thermally conductive sheet that has high thermal conductivity.
A method for producing a thermally conductive sheet S includes a step of obtaining a thermally conductive composition by mixing a reactive liquid resin, which forms a rubbery or gelatinous matrix when crosslinked, a volatile liquid having a boiling point 10° C. or more higher than a curing temperature of the reactive liquid resin, and a thermally conductive filler; a step of forming a molded body by
(Continued)

crosslinking and curing the reactive liquid resin at a temperature 10° C. or more lower than the boiling point of the volatile liquid; and a step of evaporating the volatile liquid by heating the molded body, in which these steps are performed sequentially.

5 Claims, 1 Drawing Sheet (51) Int. Cl.
*C08K 3/22* (2006.01)
*C08K 7/06* (2006.01)
*C08L 101/00* (2006.01)
*B29C 35/02* (2006.01)
*B29C 39/00* (2006.01)
*B29C 39/38* (2006.01)
*B29C 69/00* (2006.01)
*C08G 77/06* (2006.01)
*C08K 3/04* (2006.01)
*B29K 83/00* (2006.01)
*B29K 507/04* (2006.01)
*B29L 7/00* (2006.01)

(52) U.S. Cl.
CPC ........... *B29C 69/001* (2013.01); *C08G 77/06* (2013.01); *C08J 5/18* (2013.01); *C08K 3/04* (2013.01); *C08K 3/22* (2013.01); *C08K 7/06* (2013.01); *C08L 101/00* (2013.01); *B29K 2083/00* (2013.01); *B29K 2507/04* (2013.01); *B29K 2995/0013* (2013.01); *B29L 2007/002* (2013.01); *C08J 2383/04* (2013.01); *C08K 2003/2227* (2013.01); *C08K 2201/001* (2013.01)

(58) Field of Classification Search
CPC ..... C08J 2383/07; C08J 5/18; H01L 23/3737; H01L 23/3733; B29K 2083/005; B29K 2507/04; B29K 2509/08; B29K 2995/0013; C08L 83/04; C08L 7/02; C08L 2201/001; C08L 2201/014; C08K 3/04; B29L 2007/002; C08G 77/06; C08G 77/12; C08G 77/20; C09D 183/04; H01B 1/24

USPC ................ 428/447, 297.4; 252/67, 78.3, 75; 264/145, 148, 158; 427/387; 165/185

See application file for complete search history.

(56) References Cited

U.S. PATENT DOCUMENTS

| | | |
|---|---|---|
| 2010/0006798 A1 | 1/2010 | Endo |
| 2013/0136895 A1 | 5/2013 | Usui et al. |
| 2014/0346710 A1 | 11/2014 | Usui et al. |
| 2015/0118505 A1 | 4/2015 | Aramaki |
| 2015/0144316 A1* | 5/2015 | Aramaki ............... B29C 48/07 165/185 |
| 2016/0118316 A1* | 4/2016 | Aramaki ............ H01L 23/3733 257/712 |
| 2017/0253783 A1 | 9/2017 | Naito et al. |

FOREIGN PATENT DOCUMENTS

| | | |
|---|---|---|
| JP | 11233694 A | 8/1999 |
| JP | 2005146057 A | 6/2005 |
| JP | 2008-38137 A | 2/2008 |
| JP | 2008280395 A | 11/2008 |
| JP | 2010018646 A | 1/2010 |
| JP | 2014-31501 A | 2/2014 |
| JP | 2014201627 A | 10/2014 |
| WO | 2011158942 A1 | 12/2011 |
| WO | 2013/015233 A1 | 1/2013 |
| WO | 2016/031212 A1 | 3/2016 |

OTHER PUBLICATIONS

Extended European Search Report dated Oct. 30, 2019, issued by the European Patent Office in corresponding European Application No. 17789227.0-1105, (8 pages).
Office Action (Notice of Reasons for Rejection) dated Dec. 1, 2019, by the Japanese Patent Office in corresponding Japanese Patent Application No. 2018-514235, and an English Translation of the Office Action. (8 pages).
International Search Report (PCT/ISA/210) dated Jul. 11, 2017, by the Japanese Patent Office as the International Searching Authority for International Application No. PCT/JP2017/014533.
Written Opinion (PCT/ISA/237) dated Jul. 11, 2017, by the Japanese Patent Office as the International Searching Authority for International Application No. PCT/JP2017/014533.

* cited by examiner

THERMALLY CONDUCTIVE COMPOSITION, THERMALLY CONDUCTIVE SHEET, AND METHOD FOR PRODUCING THERMALLY CONDUCTIVE SHEET

TECHNICAL FIELD

The present invention relates to a thermally conductive composition and a thermally conductive sheet to be disposed between a heat-generating element and a heat-dissipating element and used, and to a method for producing the thermally conductive sheet.

BACKGROUND ART

In some electronic appliances such as computers and automobile parts, heat-dissipating elements, such as heat sinks, for dissipating heat generated from heat-generating elements, such as semiconductor devices and mechanical parts, are used, and thermally conductive sheets are sometimes placed between the heat-generating elements and the heat-dissipating elements to enhance the efficiency of transferring heat to the heat-dissipating elements. One example of such thermally conductive sheets is a thermally conductive sheet disclosed in Japanese Unexamined Patent Application Publication No. 2005-146057 (PTL 1), in which carbon fibers are loaded as a thermally conductive material and oriented.

CITATION LIST

Patent Literature

PTL 1: Japanese Unexamined Patent Application Publication No. 2005-146057

SUMMARY OF INVENTION

Technical Problem

Recent years have seen further advancement in miniaturization and performance of electronic appliances, and the amount of heat generated has increased steadily. Thus, thermally conductive sheets with higher thermal conductivity are anticipated.

The present invention has been made under the circumstances described above. That is, an object of the present invention is to provide a thermally conductive composition and a thermally conductive sheet that have high thermal conductivity, and a method for producing the thermally conductive sheet.

Solution to Problem

The present invention that achieves the object described above has the following features.

The present invention provides a method for producing a thermally conductive sheet, the method including a step of obtaining a thermally conductive composition by mixing a reactive liquid resin, which forms a rubbery or gelatinous matrix when crosslinked, a volatile liquid having a boiling point 10° C. or more higher than a curing temperature of the reactive liquid resin, and a thermally conductive filler; a step of forming a molded body by crosslinking and curing the reactive liquid resin at a temperature 10° C. or more lower than the boiling point of the volatile liquid; and a step of evaporating the volatile liquid by heating the molded body, in which these steps are performed sequentially.

A thermally conductive sheet prepared by this production method exhibits higher thermal conductivity than thermally conductive sheets prepared by other methods but containing the same amounts of carbon fibers and thermally conductive fillers other than carbon fibers. The reason for this is presumably that contraction caused by evaporation of the volatile liquid promotes the contact between the thermally conductive fillers, such as carbon fibers, and the like, contained therein. Another conceivable reason is that breaking of the carbon fibers can be suppressed in the step of dispersing the thermally conductive fillers, such as carbon fibers, and the like, due to low viscosity of the thermally conductive composition.

Carbon fibers may be contained in the thermally conductive filler, and an orientation step of orienting the carbon fibers in a particular direction may be performed before the step of forming a molded body.

Since carbon fibers are contained in the thermally conductive filler and an orientation step of orienting the carbon fibers in a particular direction is performed before the step of forming a molded body, the thermal conductivity in the carbon fiber orientation direction can be increased.

In the step of forming a molded body, a block-shaped molded body having a thickness larger than a desired sheet thickness may be formed; a slicing step of obtaining a molded body with the desired sheet thickness by slicing the block-shaped molded body may be performed; and the step of evaporating the volatile liquid may be performed after this slicing step.

Since, in the step of forming a molded body, a block-shaped molded body having a thickness larger than a desired sheet thickness is formed, next a slicing step of obtaining a molded body with the desired sheet thickness by slicing the block-shaped molded body is performed, and then the step of evaporating the volatile liquid is performed after this slicing step, the volatile liquid can be evaporated rapidly and sufficiently. In other words, the sliced surface has an increased surface area due to exposure of the thermally conductive filler such as carbon fibers, and the like, and thus evaporation of the volatile liquid is accelerated. Thus, unlike in the case where the carbon fibers, and the like, are not exposed in the sheet surface and the resin on the surface serves as a protective film and obstructs evaporation of the volatile liquid, foaming of the volatile liquid enclosed in the sheet can be suppressed. Moreover, since foaming caused by the volatile liquid rarely occurs, it is possible to evaporate the volatile liquid at a moderately high temperature.

In the slicing step, the block-shaped molded body may be sliced at a plane substantially perpendicular to a direction in which the carbon fibers are oriented so that a molded body having the desired sheet thickness and containing the carbon fibers oriented in a thickness direction is obtained.

Since a block-shaped molded body is formed and sliced at a plane substantially perpendicular to a direction in which the carbon fibers are oriented, the volatile liquid that has migrated to the sheet surface along the carbon fibers can smoothly evaporate from the exposed end portions of the carbon fibers. Thus, the volatile liquid can be evaporated rapidly and sufficiently.

The production method described above provides the following:

1. Since the matrix is cured before evaporation of the volatile liquid, the volatile liquid can be evaporated in a short time while suppressing foaming of the volatile liquid.

2. Since the matrix is cured before evaporation of the volatile liquid, contraction caused by evaporation of the volatile liquid promotes the contact between the thermally conductive fillers, such as carbon fibers and the like, and the thermal conductivity can be increased.

3. Since curing is performed in the block-shaped molded body state, evaporation of the volatile liquid during curing of the reactive liquid resin can be suppressed.

4. Since carbon fibers and the like, are oriented and then the volatile liquid is evaporated from the surface orthogonal to the orientation direction, migration of the volatile liquid along the oriented carbon fibers in the sheet to the sheet surface is accelerated, and the volatile liquid can be evaporated in a short time.

5. Since the surface of the sheet is a sliced surface, the surface area of the sheet surface is increased, and the evaporation speed can be increased.

The present invention can be a thermally conductive sheet that includes a rubbery or gelatinous matrix having a crosslinked structure, and a thermally conductive filler, in which the thermally conductive sheet exhibits a rate of increase in weight of 0.1 to 1% when immersed in isopropyl alcohol for 3 minutes.

Regarding the thermally conductive sheet that includes a rubbery or gelatinous matrix having a crosslinked structure, and a thermally conductive filler, since the thermally conductive sheet exhibits a rate of increase in weight of 0.1 to 1% when immersed in isopropyl alcohol for 3 minutes, the thermally conductive sheet can have high thermal conductivity.

This phenomenon presumably results from rapid penetration of isopropyl alcohol into voids in the matrix where the volatile liquid used to be, and clearly constitutes the difference from thermally conductive sheets of related art that do not have such voids and that exhibit a rate of increase in weight of less than 0.1%.

The thermally conductive filler in the thermally conductive sheet may contain carbon fibers having fiber axis directions oriented in a sheet thickness direction.

Since the thermally conductive filler in the thermally conductive sheet contains carbon fibers having fiber axis directions oriented in a sheet thickness direction, thermal conductivity in the orientation direction can be increased compared to the thermally conductive sheets in which carbon fibers are not oriented.

The matrix of the thermally conductive sheet may be formed of a cured body of an addition-reaction-type silicone. Since the matrix of the thermally conductive sheet is formed of a cured body of an addition-reaction-type silicone, a large amount of the thermally conductive filler can be loaded, and a thermally conductive sheet having high thermal conductivity is obtained.

The matrix of the thermally conductive sheet may be formed of a cured body of a reactive liquid resin that forms a rubbery or gelatinous matrix when crosslinked, and may contain a non-volatile liquid having a boiling point exceeding 200° C.

Since the matrix of the thermally conductive sheet is formed of a cured body of a reactive liquid resin that forms a rubbery or gelatinous matrix when crosslinked, and contains a non-volatile liquid having a boiling point exceeding 200° C., the thermally conductive sheet can be prevented from becoming excessively hard after the volatile liquid is evaporated. In particular, when a relatively large amount of the volatile liquid is blended and a large amount of the thermally conductive filler is loaded, the thermally conductive sheet tends to become hard; however, by replacing some part of the volatile liquid with the non-volatile liquid, the hardness of the thermally conductive sheet can be adjusted.

The present invention also provides a thermally conductive composition that contains a reactive liquid resin, which forms a rubbery or gelatinous matrix when crosslinked, a volatile liquid, and a thermally conductive filler, in which the volatile liquid has a boiling point 10° C. or more higher than a curing temperature of the reactive liquid resin.

Since the thermally conductive composition contains a reactive liquid resin, which forms a rubbery or gelatinous matrix when crosslinked, a volatile liquid, and a thermally conductive filler, and the volatile liquid has a boiling point 10° C. or more higher than a curing temperature of the reactive liquid resin, the volatile liquid is not evaporated during the reactive liquid resin is cured, can be evaporated after the reactive liquid resin is sufficiently cured.

The thermally conductive composition may contain a non-volatile liquid having a boiling point higher than the boiling point of the volatile liquid.

Since the thermally conductive composition contains a non-volatile liquid having a boiling point higher than the boiling point of the volatile liquid, the thermally conductive sheet can be prevented from becoming excessively hard after evaporation of the volatile liquid. In particular, when a relatively large amount of the volatile liquid is blended and a large amount of the thermally conductive filler is loaded, the thermally conductive sheet tends to become hard; however, by replacing some part of the volatile liquid with the non-volatile liquid, the hardness of the thermally conductive sheet can be adjusted.

Advantageous Effects of Invention

According to the thermally conductive composition and the thermally conductive sheet of the present invention, the thermal conductivity can be increased.

According to the method for producing a thermally conductive sheet of the present invention, a thermally conductive sheet with high thermal conductivity can be produced.

DESCRIPTION OF EMBODIMENTS

A thermally conductive composition and a thermally conductive sheet of the present invention will now be described in further detail through embodiments.

A thermally conductive composition is a liquid composition in which a thermally conductive filler, such as carbon fibers, is mixed with and dispersed in a reactive liquid resin, which will form a rubbery or gelatinous matrix when crosslinked, and a volatile liquid. A thermally conductive sheet is a solid sheet-shaped article in which a thermally conductive filler, such as carbon fibers, is contained in a matrix cured by crosslinking of the reactive liquid resin. First, the materials contained in the thermally conductive composition and the thermally conductive sheet are described.

Reactive Liquid Resin and Matrix:

The reactive liquid resin is liquid before the reaction, and forms a crosslinked structure when cured under particular conditions. The matrix is a rubbery or a gel resulting from curing of the reactive liquid resin and formation of the crosslinked structure. The crosslinked structure refers to a polymer, at least part of which is three-dimensionally crosslinked and which forms a cured body that does not melt under heating.

Examples of the reactive liquid resin include thermosetting rubbers and gels, more specifically, addition-reaction-type silicone, a urethane rubber utilizing the reaction between a polyol and an isocyanate, an acrylic rubber utilizing the radical reaction or cation reaction of an acrylate, and an epoxy resin having a flexible skeleton. Preferably, the addition-reaction-type silicone is used. This is because the addition-reaction-type silicone can be easily loaded with a large amount of thermally conductive filler, such as carbon fibers, and can be adjusted to cure at a particular temperature by using a catalyst or the like. More specifically, a combination of an alkenyl-group-containing polyorganosiloxane and hydrogen organopolysiloxane is preferable since the viscosity is low and a large amount of the thermally conductive filler can be loaded. Photosetting rubbers and gels can also be used.

The reactive liquid resin used is a resin that cures at a temperature (T2) 10° C. or more lower than the boiling point (T1) of the volatile liquid described below. A resin that cures at a temperature 20° C. or more lower than the boiling point of the volatile liquid is preferable.

When the difference between the curable temperature and the boiling point T1 is less than 10° C., the volatile liquid evaporates as the curing reaction proceeds, and air bubbles may be generated in the cured product due to evaporation. These air bubbles not only disturb the orientation of the carbon fibers but also significantly degrade the thermal conductivity of the thermally conductive sheet due to their heat insulating effect. The curing time at the curable temperature is not particularly limited; however, the time is preferably set so that 10% or less of the volatile liquid is evaporated by the time the liquid turns into a solid by the progress of curing. Moreover, in view of the productivity, the curing time is preferably 120 minutes or shorter.

When carbon fibers are contained as a thermally conductive filler, the reactive liquid resin preferably has low viscosity before curing so that the carbon fibers contained therein are oriented, and preferably has curable properties under particular conditions after the orientation.

Volatile Liquid:

The volatile liquid is a component that homogeneously mixes with the reactive liquid resin and is evaporated after the reactive liquid resin is cured. The volatile liquid has a particular boiling point (T1) determined according to the temperature at which the reactive resin cures. That is, the volatile liquid has a boiling point (T1) 10° C. or more higher than the temperature (T2) at which the reactive liquid resin cures, and preferably has a boiling point 20° C. or more higher than the temperature (T2).

The temperature T1 is determined based on the relationship with the temperature T2, and is preferably in the range of 60 to 200° C. and more preferably in the range of 100 to 130° C. When the boiling point T1 is lower than 60° C., the curing temperature of the reactive liquid resin becomes relatively low, and the curing reaction may proceed at room temperature, possibly resulting in an extremely short pot life. Meanwhile, when the boiling point T1 exceeds 200° C., the cured body of the reactive liquid resin may be deteriorated at a temperature of evaporating the volatile liquid. Moreover, as long as the boiling point is 100° C. or higher, the curing temperature of the reactive liquid resin can be set to about 80° C., and thus the pot life at room temperature can be sufficiently extended. Meanwhile, as long as the boiling point is 130° C. or lower, the volatile liquid can be evaporated in a short time by heating to about 150° C., and thus deterioration of the addition-reaction-type silicone, which serves as the matrix, can be unfailingly suppressed.

The amount of the volatile liquid added is preferably 10 to 60 parts by mass relative to 100 parts by mass of the reactive liquid resin. At an amount less than 10 parts by mass, the effect of increasing the thermal conductivity is small. At an amount exceeding 60 parts by mass, the evaporation amount is excessively large, the thermally conductive sheet is likely to foam, and, after curing, some of the volatile liquid remains and the thermally conductive sheet may become soft more than requires. Examples of the volatile liquid that can be used include aromatic compounds such as toluene and other compounds compatible with the reactive liquid resin.

The amount of the thermally conductive filler, such as carbon fibers, added is limited to a certain extent since, if carbon fibers are to be oriented in the thermally conductive composition, the viscosity is limited to a level that allows this orientation to occur. However, when a volatile liquid is contained as a liquid component, the volatile liquid can be evaporated after the orientation of the carbon fibers, and as a result, the blend ratio of the thermally conductive filler, such as carbon fibers, among all components can be increased. Thus, compared to the case in which carbon fibers are oriented without using a volatile liquid, a large amount of carbon fibers can be loaded when a volatile liquid is used, and the thermal conductivity can be increased.

Non-Volatile Liquid:

The thermally conductive composition and the thermally conductive sheet can contain a non-volatile liquid, which is practically non-volatile at the temperature T1, which is the boiling point of the volatile liquid. This non-volatile liquid can have a boiling point higher than the boiling point of the volatile liquid, and preferably has a boiling point higher than 200° C. The non-volatile liquid preferably homogeneously mixes with the reactive liquid resin, and remains in the thermally conductive sheet to serve as a plasticizer. Thus, the thermally conductive sheet can be made flexible, and the contact thermal resistance between the thermally conductive sheet and a heat-generating element or heat-dissipating element can be decreased.

Moreover, when a liquid having lower viscosity than the reactive liquid resin is selected as the non-volatile liquid, the viscosity of the thermally conductive composition can be decreased. This means that an effect of enhancing the orientation property can be expected, or that larger amounts of carbon fibers and a thermally conductive filler other than the carbon fibers described later can be loaded. Thus, the thermal conductivity of the thermally conductive composition and the thermally conductive sheet can be increased.

The amount of the non-volatile liquid added is preferably 10 to 200 parts by mass relative to 100 parts by mass of the reactive liquid resin. At an amount less than 10 parts by mass, the effect of decreasing the viscosity and the effect of making the thermally conductive sheet flexible are small; and at an amount exceeding 200 parts by mass, the proportion of the matrix becomes relatively smaller, which may result in degradation of the strength of the thermally conductive sheet and occurrence of bleeding.

Thermally Conductive Filler:

Examples of the thermally conductive filler to be contained in the matrix are, first of all, carbon fibers and flake graphite powder. Carbon fibers may have any shape, such as a filament shape, a rod shape, or a needle shape, and have significantly high thermal conductivity in the fiber axis directions. Thus, when the fiber axis directions are oriented in a particular direction, the thermal conductivity in that particular direction can be increased. Flake graphite powder has graphite crystal planes spreading in the surface direction, and has significantly high thermal conductivity isotropically within the surface. Thus, when the surface directions of the flake surfaces are oriented in the sheet thickness direction, the thermal conductivity in the sheet thickness direction can be increased.

The carbon fibers are preferably graphitized, and examples of the material therefor include fused polycyclic hydrocarbon compounds such as naphthalene, and fused heterocyclic compounds such as polyacrylonitrile (PAN), pitch, and polybenzazole fibers, among which mesophase pitch or polybenzazole fibers are preferably used. When mesophase pitch is used, the anisotropy thereof causes the pitch to orient in the fiber axis direction in the spinning step, and thus graphitized carbon fibers having excellent thermal conductivity in that fiber axis direction can be obtained. The mesophase pitch is not particularly limited as long as it can be spun, and the mesophase pitch may be used alone or may be used in combination of two or more types as appropriate; however, from the viewpoints of high thermal conductivity, spinnability, and quality stability, mesophase pitch is particularly preferably used alone, that is, graphitized carbon fibers having a mesophase pitch content of 100% is particularly preferable.

Meanwhile, polybenzazole fibers have aromatic rings in the main chains, and when the fibers are heat-treated to be graphitized, carbon powder in which the graphite layer planes are highly developed in the main chain direction can be obtained. Thus, the obtained carbon fibers have particularly excellent thermal conductivity in a direction perpendicular to the C axis of the hexagonal graphite crystal structure, in other words, a direction parallel to the base plane (graphite layer plane). In particular, a polymer material having aromatic rings in the main chain has a higher graphitizing tendency when the number of aromatic ring structures is large, and carbon fibers having extremely excellent thermal conductivity can be obtained by using polybenzazole fibers.

Examples of the carbon fibers that can be used include carbon fibers obtained by sequentially performing processes of spinning, infusibilizing, and carbonizing, and then performing crushing or cutting into a particular particle diameter, followed by graphitizing, and carbon fibers obtained by performing carbonizing, crushing or cutting, and then graphitizing. When crushing or cutting is performed before graphitizing, a polycondensation reaction and a cyclization reaction progress more smoothly during the graphitization process at newly exposed surfaces resulting from crushing; thus, the degree of graphitization can be increased, and graphitized carbon fibers with further improved thermal conductivity can be obtained. Meanwhile, when spun carbon fibers are graphitized and then crushed, the carbon fibers after graphitizing are hard and thus are easy to crush; thus, carbon fibers with a relatively narrow fiber length distribution can be obtained by performing crushing for a short time.

The fiber diameter of the carbon fibers is preferably 5 to 20 μm. Industrial production can be smoothly carried out when the fiber diameter is in the range of 5 to 20 μm, and the thermal conductivity of the sheet can be increased. In contrast, the productivity is degraded when the fiber diameter is smaller than 5 μm or larger than 20 μm.

The average fiber length of the carbon fibers is preferably 10 to 600 μm and more preferably 80 to 500 μm. When the average fiber length is smaller than 10 μm, the carbon fibers in the polymer matrix contact less with one another, not enough heat transfer paths are created, and the thermal conductivity may be degraded. Meanwhile, when the average fiber length is larger than 600 μm, the carbon fibers become bulky, and it becomes difficult to load a large amount of carbon fibers in the matrix. Note that the average fiber length can be calculated from the particle size distribution from observation of the carbon fibers with a microscope.

The average fiber length of the carbon fibers is preferably 40% or less of the sheet thickness, and the content of the carbon fibers having a fiber length exceeding 80% of the sheet thickness is preferably 5 mass % or less. This is because when the content of the carbon fibers having a fiber length exceeding 80% of the sheet thickness exceeds 5 mass % and the sheet is compressed, the number of carbon fibers that exceed that compressed thickness becomes large. Meanwhile, as long as the average fiber length of the carbon fibers is 50% or less of the sheet thickness, the amount of the carbon fibers larger than the sheet thickness can be decreased even when the sheet is compressed. Due to these issues, the particle size distribution of the carbon fibers is preferably narrow. From the viewpoint of increasing the thermal conductivity, it is preferable to use a mixture of multiple types of carbon fibers having different particle size distributions.

The aspect ratio of the carbon fibers preferably exceeds 2. This is because when the aspect ratio is 2 or less, it becomes difficult to orient the carbon fibers in a particular direction and to enhance the thermal conductivity. The aspect ratio is more preferably 5 or more. Here, the aspect ratio refers to the value of "length of fiber/diameter of fiber" of a carbon fiber.

The thermal conductivity in the fiber axis direction of the carbon fibers is preferably 400 W/m·K or more, more preferably 800 W/m·K or more, and particularly preferably 1000 W/m·K or more. This is to increase the thermal conductivity of the thermally conductive sheet.

The carbon fiber content relative to 100 parts by mass of the matrix is preferably 60 to 250 parts by mass. When the content is less than 60 parts by mass, it becomes difficult to increase the thermal conductivity, and when the content exceeds 250 parts by mass, the viscosity of the thermally conductive composition increases, and the orientation property may be degraded.

The flake graphite powder contains flat graphite powder having a shape also known as a squamous shape or the like. Flake graphite powder has graphite crystal planes spreading in the surface direction, and has significantly high thermal conductivity isotropically within the surface. Thus, when the surface directions of the flake surfaces are oriented in the sheet thickness direction, the thermal conductivity in the sheet thickness direction can be increased. Meanwhile, the normal directions to the flake surfaces are randomly oriented. Thus, the sheet is configured not to exhibit anisotropy in the sheet spreading direction but to conduct heat isotropically.

Examples of the flake graphite powder include natural graphite and artificial graphite, but flake graphite powder prepared by pyrolyzing a polymer film and crushing the resulting artificial graphite sheet is preferably used. According to this flake graphite powder, the thermal conductivity in the sheet surface direction can be increased. The polymer film serving as a raw material for graphitization is preferably an aromatic polymer such as polyimide. This is because a graphite film having high thermal conductivity and developed graphite structures can be obtained.

The aspect ratio of the flake graphite powder preferably exceeds 2. When the aspect ratio is 2 or less, it becomes difficult to orient the flake graphite powder in a particular direction and to increase the thermal conductivity. The aspect ratio is more preferably 5 or more. Here, the aspect ratio refers to the value of "length of long axis of flake surface/thickness (short axis)" of the flake graphite powder. Furthermore, although the effect of increasing the thermal conductivity in the orientation direction per unit weight is strengthened by increasing the aspect ratio, an excessively high aspect ratio tends to increase the viscosity of the thermally conductive composition. From this viewpoint, the aspect ratio is more preferably in the range of 10 to 1000.

The flake graphite powder preferably has an average particle diameter in the range of 10 to 400 μm. At an average particle diameter of less than 10 μm, the viscosity increases significantly, and the properties are difficult to improve. Furthermore, at an average particle diameter exceeding 400 μm, detachment from the sheet becomes notable.

The flake graphite powder content relative to 100 parts by mass of the matrix is preferably 10 to 70 parts by mass and more preferably 20 to 60 parts by mass. When the content is less than 10 parts by mass, it becomes difficult to increase the thermal conductivity, and when the content exceeds 70 parts by mass, the viscosity of the thermally conductive composition increases, the orientation property may be degraded, and the thermal conductivity may not increase. At a content in the range of 20 to 60 parts by mass, the thermal conductivity can be drastically increased.

The content of the thermally conductive filler, i.e., the total content of the carbon fibers and the flake graphite powder, in the matrix relative to 100 parts by mass of the matrix is preferably 80 to 300 parts by mass. This is because, at a content less than 80 parts by mass, there is a possibility that the thermal conductivity cannot be sufficiently increased, and, at a content exceeding 300 parts by mass, not only the thermal conductivity cannot be significantly increased, but also the viscosity of the thermally conductive composition becomes excessively high, thereby making it difficult to orient the carbon fibers and the flake graphite powder.

The observation on the thermal conductivity by comparing the carbon fibers and the flake graphite powder is as follows.

Carbon fibers, which have a substantially uniaxial rod shape, are characterized in that the carbon fibers have small flow resistance in the liquid resin and are easy to orient and in that a large quantity of carbon fibers are easily loaded since the viscosity does not increase easily. However, because the carbon fibers are uniaxial, the area in which the carbon fibers contact other thermally conductive filler is small, and the thermal conductivity is difficult to increase unless a large quantity of the carbon fibers are loaded.

Flake graphite powder, which is flaky, is characterized in that the flake graphite powder has large flow resistance in the liquid resin and is difficult to orient and in that a large quantity of the flake graphite powder is difficult to load since the viscosity easily increases. However, because of the flake shape, the contact area with other thermally conductive fillers is large, and presumably the thermal conductivity can be easily increased by loading a relatively small amount.

Actually, the upper limit of the viscosity for orienting the carbon fibers and the flake graphite powder in the thermally conductive composition is about 1000 Pa·s when the flow orientation is utilized such as when extrusion molding is conducted, and is about 500 Pa·s when orientation is achieved by applying a magnetic field. Assuming that a thermally conductive filler is to be added within this particular viscosity range that enables orientation, a relatively large amount of carbon fibers can be loaded if the carbon fibers alone are contained, but it is difficult to increase the thermal conductivity to the desired level. Meanwhile, if the flake graphite powder alone is to be added, the thermal conductivity may be easily increased, but a large amount of the flake graphite powder cannot be loaded, and it is also difficult to increase the thermal conductivity to the desired level.

However, when the total amount of the carbon fibers and the flake graphite powder is set to be 100% and when the percentage of the carbon fibers is set in the range of 46% to 92%, the thermal conductivity can be increased compared to when the carbon fibers are used alone or the flake graphite powder is used alone. When the percentage is in the range of 54% to 85%, the thermal conductivity can be drastically increased.

Examples of the thermally conductive filler to be contained in the thermally conductive composition and the thermally conductive sheet include, in addition to carbon fibers and flake graphite powder (hereinafter, may be referred to as "carbon fibers and the like."), spherical or irregular-shaped powders of metals, metal oxides, metal nitrides, metal carbides, metal hydroxides, and the like, and spherical graphite. Examples of the metals include aluminum, copper, and nickel, examples of the metal oxides include aluminum oxide, magnesium oxide, zinc oxide, and quartz, and examples of the metal nitrides include boron nitride and aluminum nitride. An example of the metal carbide is silicon carbide, and an example of a metal hydroxide is aluminum hydroxide. Among these thermally conductive powders, aluminum oxide and aluminum are preferable since they have high thermal conductivity, and spherical products are available; and aluminum hydroxide is preferable since availability is high and the flame retardancy of the thermally conductive sheet can be improved.

The aspect ratio of such a thermally conductive filler is preferably 2 or less. This is because at an aspect ratio exceeding 2, the viscosity readily increases, and it is difficult to load a large amount. Conversely, a powder having an aspect ratio of 2 or less does not readily increase the viscosity of the thermally conductive composition even when the amount added is relatively large; and when powders having different particle diameters are used in combination, an effect of decreasing the viscosity of the thermally conductive composition is enhanced compared to when one such a powder is used alone. Thus, the shape thereof is preferably spherical.

A non-magnetic or an extremely low magnetic thermally conductive powder is preferably used as the thermally conductive filler other than the carbon fibers. When a thermally conductive composition is placed in a strong magnetic field of about 1 T (tesla) or higher, the carbon fibers can be oriented in the desired direction, although this depends on the viscosity of the thermally conductive composition. Meanwhile, a non-magnetic or extremely low magnetic thermally conductive powder has no or very little interaction in the magnetic field; thus, the non-magnetic or extremely low magnetic thermally conductive powder can be randomly dispersed without being oriented in the thermally conductive sheet. Thus, adding a non-magnetic or extremely low magnetic thermally conductive powder to the thermally conductive sheet enhances heat transfer not only in the sheet thickness direction but also in the surface direction. Thus, this thermally conductive powder contributes to the action of linking the carbon fibers in the sheet surface direction, and the thermal conductivity in the sheet thickness direction can also be improved.

The average particle diameter of the thermally conductive filler other than the carbon fibers is preferably 0.5 to 50 μm. When the average particle diameter exceeds 50 μm, the size thereof approaches the size of the carbon fibers and the like, and orientation of the carbon fibers and the like may be disturbed. Meanwhile, a thermally conductive filler having an average particle diameter of less than 0.5 μm has a large specific surface area; thus, the viscosity increases, and it is difficult to load a large amount of such a filler. However, as long as the loadability is not adversely affected, a thermally conductive filler having a diameter of less than 0.5 μm may be contained. Moreover, when carbon fibers having an average fiber length of 50 μm or less or flake graphite powder having an average particle diameter of 50 μm or less is used, a thermally conductive filler having an average particle diameter smaller than these is preferably used. The average particle diameter of the thermally conductive filler can be indicated by the volume-average particle diameter in a particle size distribution measured by a laser diffraction/scattering method (JIS R 1629).

The thermally conductive filler other than the carbon fibers is more preferably added in an amount in the range of 250 to 1000 parts by mass and more preferably in the range of 350 to 900 parts by mass relative to 100 parts by mass of the matrix. When the amount is less than 250 parts by mass, the amount of the filler existing in the gaps between the carbon fibers becomes deficient, and the thermal conductivity may be degraded. When the amount exceeds 1000 parts by mass, the effect of increasing the thermal conductivity no longer improves, and thermal conduction through the carbon fibers may even be obstructed. When the amount is within the range of 350 to 900 parts by mass, the thermal conductivity is excellent, and the viscosity of the thermally conductive composition is appropriate.

The thermally conductive fillers, namely, carbon fibers, flake graphite powder, and other thermally conductive fillers, are preferably added in a total amount of 400 to 1300 parts by mass relative to 100 parts by mass of the matrix. When the amount is less than 400 parts by mass, the thermal conductivity may be degraded. When the amount exceeds 1300 parts by mass, the effect of increasing the thermal conductivity no longer improves, and drawbacks, such as an increased hardness, become prominent.

Additives:

Various additives can be added as long as the functions of the thermally conductive sheet are not impaired. For example, organic components, such as a plasticizer, a dispersing agent, a coupling agent, and an adhesive, may be added. As additional components, a flame retardant, an antioxidant, a coloring agent, and the like may be added as appropriate.

Production Method:

Production of a thermally conductive composition and a thermally conductive sheet using the above-described raw materials will now be described.

A reactive liquid resin, a volatile liquid, a thermally conductive filler, and, if needed, a non-volatile liquid and additives are mixed and stirred so as to obtain a thermally conductive composition in which the thermally conductive filler is dispersed in the reactive liquid resin. When the reactive liquid resin is of a type that undergoes curing by mixing a main agent with a curing agent, the thermally conductive filler and the like, can be dispersed in one or both of the main agent and the curing agent, and the main agent and the curing agent are mixed to obtain a thermally conductive composition.

Next, the thermally conductive composition is poured into a particular mold. First, a method for molding the composition in a mold having a shape different from that of the thermally conductive sheet to be obtained as a final product is described as one embodiment. The mold here is used to obtain a block-shaped molded body in the stage before forming the shape of the final-product thermally conductive sheet. The method involves forming a block-shaped molded body having a substantially rectangular parallelepiped outline from the thermally conductive composition, and then cutting or machining (hereinafter, collectively referred to as "slicing") the block-shaped molded body in the subsequent step to reduce the thickness of the resulting product and to obtain a thermally conductive sheet having a desired thickness.

A magnetic field is applied to the thermally conductive composition in the mold so as to orient the carbon fibers and the flake graphite powder in the sheet thickness direction. In order to orient the carbon fibers and the like, through magnetic field orientation, the viscosity of the thermally conductive composition is preferably 10 to 500 Pa·s. This is because, at a viscosity less than 10 Pa·s, the carbon fibers and the thermally conductive filler other than the carbon fibers may settle, and, at a viscosity exceeding 500 Pa·s, the flowability is so low that the carbon fibers and the like, do not orient or take a long time to orient by the magnetic field. However, the viscosity can be set to less than 10 Pa·s in some cases by using a thermally conductive filler that does not easily settle or by combining an additive, such as antisettling agent.

Examples of the magnetic line generation source used to apply a magnetic line include a superconducting magnet, a permanent magnet, an electromagnet, and a coil, but a superconducting magnet is preferable since it can generate a magnetic field with a high magnetic flux density. The magnetic flux densities of the magnetic fields generated from these magnetic line generation sources are preferably 1 to 30 tesla. When the magnetic flux density is less than 1 tesla, it becomes difficult to orient the carbon fibers and the like. In contrast, a magnetic flux density exceeding 30 tesla is practically difficult to obtain.

The carbon fibers and the like, can be oriented by extrusion molding instead of applying the magnetic field. This is because, in extrusion molding, the properties to flow orient are utilized so that the carbon fibers and the like, can be oriented in the flow direction of the thermally conductive composition during extrusion molding. Moreover, carbon fibers and the like, can be oriented in the coating direction when the composition is applied and spread by using a slit coater and the like into a thin layer. Thin-film oriented sheets obtained as such are integrated by stacking to form a block-shaped molded body.

In the present invention, the state in which the carbon fibers are oriented refers to a state in which the fiber axis directions of more than 50% of the carbon fibers are oriented within a 15° range with respect to a particular direction. The state in which the flake graphite powder is oriented refers to a state in which the surface directions of more than 50% of the flake surfaces of the flake graphite powder are oriented within a 15° range with respect to a particular direction.

Next, while the oriented state of the carbon fibers and the like, is maintained, heating is performed to a temperature 10° C. or more lower than the boiling point (T1) of the volatile liquid so as to cure the reactive liquid resin and form a block-shaped molded body.

In the step of orienting the carbon fibers and the like, and in the step of curing the reactive liquid resin, the heating temperature is adjusted to be 10° C. or more lower than the boiling point (T1) of the volatile liquid so that evaporation of the volatile liquid can be suppressed, and generation of air bubbles due to boiling of the volatile liquid can be suppressed. Moreover, by forming the block-shaped molded body, the reactive liquid resin can be cured while the volatile liquid is retained inside.

After the reactive liquid resin is cured, the resulting block-shaped molded body is sliced at a plane substantially perpendicular to the orientation direction of the carbon fibers, and the like, so as to perform a slicing step of preparing oriented sheets in which the carbon fibers, and the like, are oriented in the thickness direction. Various means such as a blade, a wire rod, and a laser may be employed as the cutting means, and a shear blade, a push-cutting blade, a plane, or the like can be used as the blade. In order to plane the obtained block-shaped molded body, the blade angle with respect to the plane flat surface is set to 45°, the length of the blade protruding from the plane surface is set to 0.5 mm, and the block-shaped molded body can be planed by pressing the plane against the block-shaped molded body at a pressure of about 0.2 to 0.3 MPa.

The surface of the resulting thermally conductive sheet subjected to this slicing step turns into a sliced surface.

A polishing step can be performed on the sliced surface if needed. In the polishing step, abrasive paper, a cloth, a file, or the like is used to polish end surfaces of the carbon fibers exposing from the sheet surface. In this manner, the end surfaces of the exposed carbon fibers and the like, are squashed flat. These end surfaces have effects of increasing the adhesion with the heat-generating element or a heat-dissipating element and of decreasing the thermal resistance of the thermally conductive sheet obtained as a final product.

In the method described heretofore, a block-shaped molded body is formed first; alternatively, a sheet-shaped molded body having a desired size can be molded from the beginning. In this case, after the carbon fibers and the like, are oriented, the steps up to and including the step of curing the reactive liquid resin are performed instead of forming the block-shaped molded body described above. The subsequent steps are the same as the handling of the thermally conductive sheet obtained by slicing the block-shaped molded body.

Next, an evaporating step of heating the sliced thermally conductive sheet to evaporate the volatile liquid is performed. Here, the heating temperature is preferably higher than or equal to the boiling point T1 of the volatile liquid. This is because the volatile liquid can be rapidly evaporated at a temperature higher than or equal to the boiling point. In order to perform this evaporating step, a curing step of curing the reactive liquid resin must be performed in advance. If the order of performing the steps is reversed, that is, if the reactive liquid resin is cured after the volatile liquid is evaporated, the process is the same as loading the thermally conductive filler without a particular volatile liquid, and the thermal conductivity cannot be increased. The reason behind the increase in thermal conductivity achieved by evaporating the volatile liquid after curing of the reactive liquid resin is not clear; however, it can be presumed that the thermally conductive filler immobilized in the cured matrix contacts strongly with each other due to contraction associated with the evaporation of the volatile liquid. Conversely, presumably, if the volatile liquid is evaporated before the matrix is cured, the thermally conductive filler remains un-immobilized, and stress due to contraction is moderated; thus, the contact state is not improved.

There is also an additional effect that, when the volatile liquid is evaporated after the matrix is cured, foaming rarely occurs due to the cured matrix even when heating is performed at a temperature higher than the boiling point T1 of the volatile liquid. Thus, there is also an advantage in that while the issue of foaming is suppressed, the volatile liquid can be evaporated in a short time.

Then, after a block-shaped molded body with the cured matrix is prepared, the block-shaped molded body is sliced to form a thin sheet; thus, compared to the case in which a matrix in a thin sheet shape is cured without forming the block-shaped molded body, the volatile liquid tends to stay inside and does not readily evaporate. In other words, when a block-shaped molded body is formed, not only the surface area is small as a whole, but also a skin layer with a high matrix density is formed on the surfaces of the block-shaped molded body, and this resin layer serves as a protective film that prevents evaporation of the volatile liquid. In contrast, after slicing, not only the surface area increases but also the end portions of the oriented carbon fibers and the like, are exposed in the sheet surfaces, thereby eliminating the skin layer; thus, the volatile liquid that has migrated to the sheet surfaces along the carbon fibers and the like, evaporates easily from the exposed end portions of the carbon fibers and the like. Thus, a two-stage process involving curing the matrix and evaporation of the volatile liquid can be smoothly carried out by forming a block-shaped molded body, and an issue of evaporation of the volatile liquid during curing of the matrix can be easily avoided.

It is presumed that a thermally conductive sheet produced by the steps of curing the reactive liquid resin and then evaporating the volatile liquid has a crosslinked structure in which voids from which the volatile liquid has been released form a sponge-like structure. In other words, even when the volatile liquid is evaporated and removed from the three-dimensionally crosslinked matrix that incorporates the volatile liquid, contraction occurs while the crosslinked state of the matrix remains unchanged. Although it is difficult to analyze this state, it is presumed if a sheet having voids where the volatile liquid used to be is immersed in isopropyl alcohol, which has permeability, isopropyl alcohol rapidly enters the voids where the volatile liquid used to be.

Properties of Thermally Conductive Composition:

The thermally conductive composition can be easily applied between a heat-generating element and a heat-dissipating element. Subsequently, the reactive liquid resin is cured at a desired temperature, and the volatile liquid is evaporated at a temperature higher than or equal to the boiling point of the volatile liquid higher than the curing temperature to obtain a cured body of the thermally conductive composition having high thermal conductivity.

Properties of Thermally Conductive Sheet:

The thermally conductive sheet can have high thermal conductivity. This thermally conductive sheet is difficult to distinguish from existing thermally conductive sheets from appearance, compositional analysis, or even structural analysis. However, the difference is that whereas the rate of increase in weight of existing thermally conductive sheets immersed in isopropyl alcohol for 3 minutes is generally 0.05% or less, the rate of increase in weight of this thermally conductive sheet is 0.1 to 1%.

The reason for selecting isopropyl alcohol as the solvent for impregnation is because isopropyl alcohol does not dissolve the matrix and has appropriate affinity to the matrix.

For example, if water, which has low affinity to the matrix, is selected, the weight increase rarely occurs and no change is observed in any of the thermally conductive sheets immersed therein. In contrast, if toluene, which has excessively high affinity to the matrix, is selected, extensive swelling occurs irrespective of the crosslinked state of the matrix, and a large increase in weight occurs and changes are difficult to detect in any of the thermally conductive fillers immersed therein.

EXAMPLES

Preparation of Thermally Conductive Composition
Sample 1:
To 100 parts by mass of an addition-reaction-type silicone serving as a main agent, 60 parts by mass of toluene (boiling point: 110.6° C.) serving as a volatile liquid, 230 parts by mass of carbon fibers (average fiber length: 150 μm), 120 parts by mass of aluminum oxide A (spherical, average particle diameter: 10 μm) and 600 parts by mass of aluminum hydroxide (irregular shape, average particle diameter: 8 μm) serving as thermally conductive fillers other than the carbon fibers, and 100 parts by mass of dimethyl silicone oil (viscosity: 1000 cps) serving as a non-volatile liquid were added to obtain a thermally conductive composition (main agent). Furthermore, for a curing agent of the addition-reaction-type silicone, as with the main agent, to 100 parts by mass of a curing agent of the addition-reaction-type silicone, 60 parts by mass of toluene (boiling point: 110.6° C.) serving as a volatile liquid, 230 parts by mass of carbon fibers (average fiber length: 150 μm), 120 parts by mass of aluminum oxide A (spherical, average particle diameter: 10 μm) and 600 parts by mass of aluminum hydroxide (irregular shape, average particle diameter: 8 μm) serving as thermally conductive fillers other than the carbon fibers, and 100 parts by mass of dimethyl silicone oil (viscosity: 1000 cps) serving as a non-volatile liquid were added to obtain a thermally conductive composition (curing agent). Then the thermally conductive composition (main agent) and the thermally conductive composition (curing agent) were mixed to prepare a thermally conductive composition (mixture of the main agent and the curing agent) of Sample 1. The blend is shown in Table 1.
Samples 2 to 7:
Thermally conductive compositions of Samples 2 to 7 were obtained as with Sample 1 except that the raw materials and the blend (parts by mass) were changed as shown in Table 1. Here, aluminum oxide B and aluminum oxide C serving as the thermally conductive fillers other than the carbon fibers are spherical and respectively have an average particle diameter of 3 μm and an average particle diameter of 20 μm.

As with Sample 1, in all of other samples, the same amounts of the main agent and the curing agents were prepared and mixed. The main agent and the curing agent differ from each other only in that whether the addition-reaction-type silicone is contained as a main agent or as a curing agent, and are otherwise identical in terms of the materials to be blended and the amounts of the materials to be mixed.

Regarding the raw materials described above, the average fiber length of the carbon fibers is measured with an electron microscope. Specifically, the lengths of 100 carbon fibers were measured with an electron microscope, and the average value thereof was assumed to be the average fiber length. The average particle diameter of the thermally conductive filler other than the carbon fibers is a volume-average particle diameter in a particle size distribution measured by a laser diffraction/scattering method (JIS R 1629).

TABLE 1

|  |  | Sample 1 | Sample 2 | Sample 3 | Sample 4 | Sample 5 | Sample 6 | Sample 7 |
| --- | --- | --- | --- | --- | --- | --- | --- | --- |
| Blend | Addition-reaction-type silicone | 100 | 100 | 100 | 100 | 100 | 100 | 100 |
|  | Toluene | 60 | — | — | 20 | — | 60 | — |
|  | MEK | — | — | 60 | — | — | — | — |
|  | Carbon fibers | 230 | 230 | 230 | 110 | 110 | 230 | 230 |
|  | Aluminum oxide A | 120 | 120 | 120 | — | — | 120 | 120 |
|  | Aluminum oxide B | — | — | — | 450 | 450 | — | — |
|  | Aluminum oxide C | — | — | — | 450 | 450 | — | — |
|  | Aluminum hydroxide | 600 | 600 | 600 | — | — | 600 | 600 |
|  | Dimethyl silicone oil | 100 | 160 | 100 | — | — | 100 | 160 |
| Properties | Rate of increase in weight (%) | 0.22 | 0 | 0.04 | 0.2 | 0 | 0.22 | 0.01 |
|  | Thermal conductivity (W/m · K) | 15 | 10 | 7 | 11 | 8 | 2.2 | 1.8 |

Preparation of Thermally Conductive Sheet:
The thermally conductive composition of Sample 1 described above was put through the steps of Production Example 1 described below so as to prepare a thermally conductive sheet of Sample 1. The thermally conductive composition of Sample 2 was put through the steps of Production Example 2 described below so as to prepare a thermally conductive sheet of Sample 2. In the same manner, the thermally conductive compositions of Samples 3 to 7 were put through the steps of Production Examples 3 to 7 described below so as to prepare thermally conductive sheets of Samples 3 to 7.

Production Example 1

The thermally conductive composition of Sample 1 was poured into a block-shaped mold, and while the molding material in the mold is vibrated, a 10 tesla magnetic field was applied so that the carbon fibers were oriented in the vertical direction of the mold. Subsequently, the addition-reaction-type silicone was cured by heating at 90° C. for 60 minutes, and then the molded body was released from the mold. The obtained molded body was sliced to a thickness of 0.5 mm, where the thickness direction was the orientation direction of the carbon fibers, and then further cut into a 26 mm×26 mm square sheet so as to obtain a sheet material. The sheet material was heated at 110° C. for 60 minutes, and then further heated at 150° C. for 60 minutes to evaporate the volatile liquid and to obtain a thermally conductive sheet of Sample 1.

The content of the volatile liquid in the thermally conductive composition of Sample 1 was 5.0 mass %, and it was found from the decrease in weight before and after evaporation, that 90% or more of the volatile liquid evaporated due to the heating.

Production Example 2

In Production Example 2, the same steps as in Production Example 1 were performed. However, since Sample 2 did not contain a volatile liquid but the amount of the non-volatile liquid was increased by the same amount, heating at 150° C. was performed for 60 minutes, but the evaporating step was not performed.

Production Example 3

For the thermally conductive composition of Sample 3, methyl ethyl ketone was used as the volatile liquid instead of toluene, and the same steps as those in Production Example 1 were performed. By using methyl ethyl ketone, evaporation of the volatile liquid, i.e., methyl ethyl ketone, was completed faster than completion of the curing of the addition-reaction-type silicone by heating at 90° C. for 60 minutes. Since the boiling point of methyl ethyl ketone is 79.6° C., which is lower than 90° C. of the curing temperature of the addition-reaction-type silicone, the step of evaporating methyl ethyl ketone of the volatile liquid, could be performed before the step of curing the addition-reaction-type silicone although the process was the same as that of Production Example 1. In evaporating methyl ethyl ketone, a mold not completely sealed was used so that methyl ethyl ketone could be released from the mold.

Production Example 4

In Production Example 1, the block-shaped molded body was cured and sliced, and then the volatile liquid was evaporated; however, in Production Example 4, a sheet-shaped molded body was cured and then the volatile liquid was evaporated. Specifically, the thermally conductive composition of Sample 4 was poured into a sheet-shaped mold, and while the molding material in the mold was vibrated, a 10 tesla magnetic field was applied so that the carbon fibers were oriented in the vertical direction of the mold (the thickness direction of the sheet). Subsequently, the addition-reaction-type silicone was cured by heating at 90° C. for 60 minutes, and then the molded body was released from the mold so as to obtain a 26 mm×26 mm square sheet material having a thickness of 0.5 mm. The subsequent steps were the same as those for Production Example 1.

Production Example 5

In Production Example 5, the same steps as in Production Example 4 were performed. However, since Sample 5 did not contain a volatile liquid, heating at 150° C. was performed for 60 minutes, but the evaporating step was not performed.

Production Example 6

Production Example 6 differed from Production Example 4 in that the orientation step for orienting the carbon fibers was not performed, and other than this, the same steps as those for Production Example 4 were performed.

Production Example 7

Production Example 7 differed from Production Example 5 in that the orientation step for orienting the carbon fibers was not performed, and other than this, the same steps as those for Production Example 5 were performed.

Table 2 below shows outline of the steps so that Production Examples 1 to 7 can be compared easily.

TABLE 2

|  | Production Example 1 | Production Example 2 | Production Example 3 | Production Example 4 | Production Example 5 | Production Example 6 | Production Example 7 |
|---|---|---|---|---|---|---|---|
| Composition | Sample 1 | Sample 2 | Sample 3 | Sample 4 | Sample 5 | Sample 6 | Sample 7 |
| Production steps | ↓ | ↓ | ↓ | ↓ | ↓ | ↓ | ↓ |
|  | Orientation step | Orientation step | Orientation step | Orientation step | Orientation step |  |  |
|  | ↓ | ↓ | ↓ | ↓ | ↓ | ↓ | ↓ |
|  |  |  | Evaporating step |  |  |  |  |
|  | ↓ | ↓ | ↓ | ↓ | ↓ | ↓ | ↓ |
|  | Curing step (block shape) | Curing step (block shape) | Curing step (block shape) | Curing step (sheet shape) | Curing step (sheet shape) | Curing step (sheet shape) | Curing step (sheet shape) |
|  | ↓ | ↓ | ↓ | ↓ | ↓ | ↓ | ↓ |
|  | Slicing step | Slicing step | Slicing step |  |  |  |  |
|  | ↓ | ↓ | ↓ | ↓ | ↓ | ↓ | ↓ |
|  | Evaporating step |  |  | Evaporating step |  | Evaporating step |  |
|  | ↓ | ↓ | ↓ | ↓ | ↓ | ↓ | ↓ |
| Sheet | Sample 1 | Sample 2 | Sample 3 | Sample 4 | Sample 5 | Sample 6 | Sample 7 |

Properties of Thermally Conductive Sheet

State of Sample

The thermally conductive sheets of the respective samples could be satisfactorily produced; however, the thermally conductive sheet of Sample 3 had a large number of air bubbles inside the block-shaped molded body in the evaporating step, and thus had many through holes formed of these air bubbles.

Figure 1:
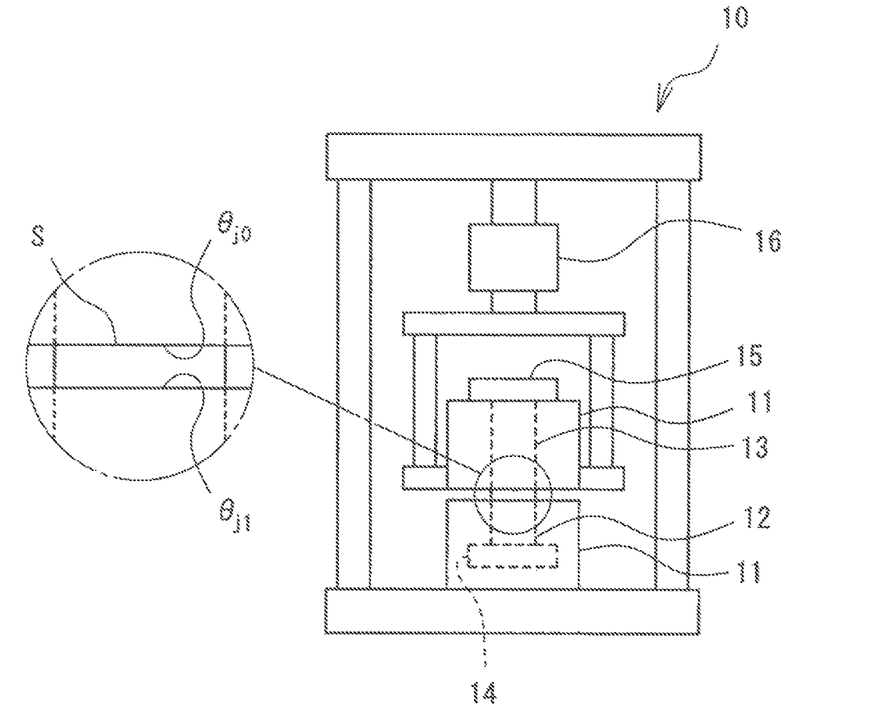
FIG. 1 is a schematic diagram of a thermal conductivity meter.

Thermal Conductivity:

The thermal conductivity of each of the thermally conductive sheets of the respective samples was measured with a thermal conductivity meter illustrated in the schematic diagram in FIG. 1 by a process in accordance with ASTM D 5470-06. More specifically, the thermally conductive sheets of the samples serving as test pieces S were each attached to a copper block 12 having a 25.4 mm×25.4 mm measurement surface and side surfaces covered with a thermal insulator 11, an upper copper block 13 was placed thereon, and a load was applied by a load cell 16 so that the compression ratio was 10%. Here, the lower copper block 12 was in contact with a heater 14. Moreover, the upper copper block 13 was connected to a heat sink 15 equipped with a fan. Next, the heater 14 was turned on so that the surface of the lower copper block 12 reached 80° C., and 15 minutes thereafter when the temperature entered a substantially steady state, the temperature ($\theta_{j0}$) of the upper copper block 13 and the amount of heat (Q) generated by the heater were measured, the thermal resistance of each sample was determined from equation (1) below, and the thermal conductivity was determined from equation (2) below. Moreover, the thickness T of each test piece S was also measured.

$$\text{Thermal resistance}=(\theta_{j1}-\theta_{j0})/Q \qquad \text{equation}(1)$$

In equation (1), $\theta_{j1}$ represents the temperature (80° C.) of the lower copper block 12, $\theta_{j0}$ represents the temperature of the upper copper block 13, and Q represents the amount of heat generated.

$$\text{Thermal conductivity}=T/\text{thermal resistance} \qquad \text{equation (2)}$$

In equation (2), T represents the thickness of each test piece.

The thermal conductivities of the thermally conductive sheets of the respective samples are shown in Table 1.

Rate of Increase in Weight:

If the thermally conductive composition or the thermally conductive sheet contains a volatile liquid, evaporating the volatile liquid decreases the volume by the amount of evaporation. It is considered that a thermally conductive sheet prepared by evaporating the volatile liquid after the reactive liquid resin is cured has voids in the matrix where the volatile liquid used to be, and thus has tendency to incorporate the solvent, whereas a thermally conductive sheet prepared by curing the reactive liquid resin after the volatile liquid is evaporated has no such voids in the matrix and has less tendency to incorporate the solvent. Based on this observation, the following experiment was conducted.

The thermally conductive sheets of the respective samples were each immersed in isopropyl alcohol for 3 minutes, and then the samples were taken out, dried by wiping away the solvent on the surfaces, and weighed. The weight was compared with the weight before immersion so as to calculate the rate (%) of increase in weight. The equation used to calculate the rate of increase in weight is equation (3) below. The results are indicated in Table 1.

$$\text{Rate (\%) of increase in weight}=[(\text{weight after immersion}-\text{weight before immersion})/\text{weight before immersion}]\times100 \qquad \text{equation (3)}$$

Observations:

The thermally conductive sheet prepared from the thermally conductive composition of Sample 1 containing a volatile liquid had a thermal conductivity 50% higher than that of the thermally conductive sheet prepared from the thermally conductive composition of Sample 2 not containing a volatile liquid. Thus, this shows that evaporating the volatile liquid after addition and curing offers a remarkably high effect on improving the thermal conductivity. Moreover, the thermally conductive sheet of Sample 3, which was the same as Sample 1 except that the volatile liquid was changed and evaporated before the reactive liquid resin was cured, had many air bubbles generated therein and had a very low thermal conductivity. This is presumably due to air bubbles inhibiting thermal conduction, and, furthermore, due to the disturbance of the orientation of the carbon fibers, as revealed through the observation of a cross section. This shows that evaporating the volatile liquid from the block-shaped molded body before curing causes foaming and is thus not preferable (samples 1 to 3).

The thermally conductive sheet of Sample 4, which was molded into a sheet shape from the beginning without forming a block-shaped molded body, also had high thermal conductivity. Sample 5, which did not contain a volatile liquid, had low thermal conductivity, and compared to this thermally conductive sheet of Sample 5, the thermally conductive sheet of Sample 4 had a thermal conductivity improved by 3 W/m·K, which is equivalent to an improvement of 38% (Samples 4 and 5).

Although the thermally conductive sheet of Sample 4 had lower thermal conductivity than the thermally conductive sheet of Sample 1, the thermal conductivity was higher than the thermally conductive sheet of Sample 2 obtained without performing the evaporating step; thus, this shows that the evaporating step has an effect of increasing the thermal conductivity to a level higher than the thermal conductivity expected from the blend amount. The thermally conductive sheet of Sample 6 containing non-oriented carbon fibers had a significantly low thermal conductivity, and this shows that orienting the carbon fibers drastically increases the thermal conductivity (samples 1, 4, and 6).

The thermally conductive sheet prepared from the thermally conductive composition of Sample 6 containing a volatile liquid had a thermal conductivity more than 20% higher than that of the thermally conductive sheet prepared from the thermally conductive composition of Sample 7 not containing a volatile liquid. In other words, this shows that even when the carbon fibers are not oriented, the evaporating step has an effect of improving the thermal conductivity (Samples 6 and 7).

The comparison between Samples 1 and 2 prepared by slicing the block-shaped molded body in which the carbon fibers were oriented shows that the thermal conductivity improved by 50%, the comparison between Samples 5 and 4 prepared as a sheet shape with oriented carbon fibers shows that the thermal conductivity improved by 38%, and the comparison between Samples 7 and 6 prepared as a sheet shape with non-oriented carbon fibers shows that the thermal conductivity improved by 22%. This shows that the effect of the evaporating step on increasing the thermal conductivity is high when carbon fibers are oriented and is significantly high when the sheet is prepared by slicing a block-shaped molded body.

The experiment that used isopropyl alcohol for immersion shows that all of the thermally conductive sheets prepared by curing the reactive liquid resin and then evaporating the volatile liquid showed a rate of increase in weight of 0.1% or more, whereas the thermally conductive sheets prepared by different steps, such as not performing the step of evaporating the volatile liquid, showed a rate of 0.04% or less. Based on this result, it was presumed that whether or not the thermally conductive sheet is obtained by curing the reactive liquid resin and then evaporating the volatile liquid can be identified by the rate of increase in weight after immersion in isopropyl alcohol.

The embodiments and examples described above are merely illustrative examples of the present invention, and alterations of the embodiments and the examples, addition of and combining with known features, and the like, are possible without departing from the gist of the present invention. Such technical features are also included in the scope of the present invention.

REFERENCE SIGNS LIST 10 thermal conductivity meter
11 thermal insulator
12 lower copper block
13 upper copper block
14 heater
15 heat sink equipped with a fan
16 load cell
S test piece
$\theta_{j0}$ temperature of upper copper block 13
$\theta_{j1}$ temperature of lower copper block 12

The invention claimed is:

1. A method for producing a thermally conductive sheet, the method comprising:
   a step of obtaining a thermally conductive composition by mixing a reactive liquid resin, which forms a rubbery or gelatinous matrix when crosslinked, a volatile liquid having a boiling point 10° C. or more higher than a curing temperature of the reactive liquid resin, and a thermally conductive filler containing carbon fibers;
   a step of orienting the carbon fibers in a same direction;
   a step of forming a block-shaped molded body having a thickness larger than a desired sheet thickness by crosslinking and curing the reactive liquid resin at a temperature 10° C. or more lower than the boiling point of the volatile liquid;
   a step of slicing the block-shaped molded body to obtain a molded body of the desired sheet thickness; and
   a step of evaporating the volatile liquid from sliced faces having no skin layer of the molded body of the desired sheet thickness by heating the molded body of the desired sheet thickness, wherein these steps are performed sequentially.

2. The method for producing a thermally conductive sheet according to claim 1, wherein, in the slicing step, the block-shaped molded body is sliced at a plane substantially perpendicular to a direction in which the carbon fibers are oriented so that a molded body having the desired sheet thickness and containing the carbon fibers oriented in a thickness direction is obtained.

3. The method for producing a thermally conductive sheet according to claim 1, wherein in the step of orienting the carbon fibers, the same direction is the fiber axis directions of more than 50% of the carbon fibers being oriented within a 15° range with respect to a certain direction.

4. A thermally conductive sheet comprising a rubbery or gelatinous matrix having a crosslinked structure, and a thermally conductive filler,
   wherein the thermally conductive filler includes carbon fibers having fiber axis directions oriented in a sheet thickness direction,
   wherein the thermally conductive sheet exhibits a rate of increase in weight of 0.1 to 1% when immersed in isopropyl alcohol for 3 minutes,
   wherein the matrix is formed of a cured body of a reactive liquid resin that forms a rubbery or gelatinous matrix when crosslinked, and contains a non-volatile liquid having a boiling point exceeding 200° C.

5. The thermally conductive sheet according to claim 4, wherein the matrix is formed of a cured body of an addition-reaction silicone.

\* \* \* \* \*